US012677389B2

(12) United States Patent
Watanabe

(10) Patent No.: US 12,677,389 B2
(45) Date of Patent: Jul. 7, 2026

(54) IN-VEHICLE DEVICE

(71) Applicant: HITACHI ASTEMO, LTD.,
Hitachinaka (JP)

(72) Inventor: Kimihito Watanabe, Hitachinaka (JP)

(73) Assignee: HITACHI ASTEMO, LTD.,
Hitachinaka (JP)

( * ) Notice: Subject to any disclaimer, the term of this
patent is extended or adjusted under 35
U.S.C. 154(b) by 118 days.

(21) Appl. No.: 18/719,373

(22) PCT Filed: Dec. 24, 2021

(86) PCT No.: PCT/JP2021/048285
§ 371 (c)(1),
(2) Date: Jun. 13, 2024

(87) PCT Pub. No.: WO2023/119641
PCT Pub. Date: Jun. 29, 2023

(65) Prior Publication Data
US 2025/0056745 A1      Feb. 13, 2025

(51) Int. Cl.
*H05K 5/02*          (2006.01)
*H05K 5/00*          (2025.01)
*H05K 5/06*          (2006.01)

(52) U.S. Cl.
CPC ......... *H05K 5/0247* (2013.01); *H05K 5/0026*
(2013.01); *H05K 5/06* (2013.01)

(58) Field of Classification Search
CPC ...... H05K 5/0247; H05K 5/0026; H05K 5/06;
B60R 16/0239; H01R 13/46; H01R
31/065; H01R 2201/26; B60L 58/10;
Y02T 10/70
See application file for complete search history.

(56) References Cited

U.S. PATENT DOCUMENTS 10,461,517 B1 * 10/2019 Vignes ..................... H02G 5/04
2008/0007929 A1 * 1/2008 Blashewski .............. H05K 5/06
361/796

(Continued)

FOREIGN PATENT DOCUMENTS

CN          206510858 U        9/2017
JP        2007216836 A    *    8/2007
(Continued)

OTHER PUBLICATIONS

Machine Translation for JP2007216836A (Year: 2025).*
(Continued)

*Primary Examiner* — Sagar Shrestha
*Assistant Examiner* — Peter Krim
(74) *Attorney, Agent, or Firm* — Foley & Lardner LLP

(57)          ABSTRACT

An in-vehicle device (1) includes: a substrate (12) on which
a power supply circuit unit to which a voltage and a current
of an in-vehicle battery are supplied and which distributes
the voltage and the current therein and a power supply-
related component (11) around the power supply circuit unit
are mounted; a connector (4, 5, 6) which is mounted on the
substrate (12) and electrically connects an external device
and the substrate (12); and a housing (3) which accommo-
dates the substrate (12) therein and includes a connector
attachment portion (2) which defines an attachment position
of the connector (4, 5, 6). The housing (3) has at least one
wall portion (17, 16) protruding toward the substrate (12)
inside the housing (3) and extending along an attachment
direction of the connector (6).

11 Claims, 9 Drawing Sheets

(56)      References Cited

U.S. PATENT DOCUMENTS

| | | | | |
|---|---|---|---|---|
| 2010/0008024 A1* | 1/2010 | Ignasiak | ................. | H02B 1/28 |
| | | | | 200/50.21 |
| 2015/0314698 A1* | 11/2015 | Price | ...................... | B60L 53/16 |
| | | | | 439/142 |
| 2017/0257959 A1 | 9/2017 | Ogitani | | |
| 2018/0241017 A1* | 8/2018 | Nakamura | ........... | H05K 5/0214 |
| 2019/0269024 A1* | 8/2019 | Okamura | .............. | G06F 1/1633 |

FOREIGN PATENT DOCUMENTS

| | | | |
|---|---|---|---|
| JP | 2013-207173 A | | 10/2013 |
| JP | 2014-207364 A | | 10/2014 |
| JP | 2017-162854 A | | 9/2017 |
| JP | 2018116354 A | * | 7/2018 |

OTHER PUBLICATIONS

Machine Translation for JP2018116354A (Year: 2025).*
International Preliminary Report on Patentability issued in corresponding International Application No. PCT/JP2021/048285, dated Jul. 4, 2024 (6 pages).
International Search Report with English Translation and Written Opinion of International Patent Application No. PCT/JP2021/048285 dated Mar. 1, 2022 (9 pages).

* cited by examiner

IN-VEHICLE DEVICE

TECHNICAL FIELD

The present invention relates to an in-vehicle device.

BACKGROUND ART

There are many types of in-vehicle devices. There are various mounting positions of the in-vehicle device. In particular, in consideration of maintainability, the in-vehicle device is mounted at a location that can be easily touched by an operator even in a state of being connected to a battery. In this case, in order to ensure the safety of the operator, a structure is generally adopted in which a human body or a tool to be used, that is, a foreign solid matter is prevented from approaching a power supply-related component of the in-vehicle device.

In the in-vehicle device, there is a technique described in PTL 1 as a structure for preventing a foreign solid matter from approaching a power supply-related component.

CITATION LIST

Patent Literature

PTL 1: JP 2017-162854 A

SUMMARY OF INVENTION

Technical Problem

In a housing of the in-vehicle device described in PTL 1, a connector cover closes a gap around a connector, thereby preventing the intrusion of the foreign solid matter. However, the connector cover of PTL 1 cannot be assembled from one direction at the time of assembly, and needs to be moved from a top to a bottom and then moved to a substrate side for attachment, which takes time and effort.

It is desirable that the in-vehicle device has a configuration in which each component can be easily assembled by a robot or the like in a recent labor saving process. Therefore, in order to absorb dimensional errors and assembly accuracy errors in individual products, it is desired that the in-vehicle device has a structure capable of preventing intrusion of a foreign solid matter into the in-vehicle device through a gap formed between a connector and a connector attachment portion and capable of being easily assembled. Note that, for example, the in-vehicle device has a structure capable of complying with a standard such as the IP standard IP4X as the structure for preventing intrusion of the foreign solid matter.

An object of the present invention is to provide an in-vehicle device capable of preventing a foreign solid matter from approaching a power supply-related component and having excellent assemblability.

Solution to Problem

An in-vehicle device according to one aspect of the present invention includes: a substrate on which a power supply circuit unit to which a voltage and a current of an in-vehicle battery are supplied and which distributes the voltage and the current therein and a power supply-related component around the power supply circuit unit are mounted; a connector which is mounted on the substrate and electrically connects an external device and the substrate;

and a housing which accommodates the substrate therein and includes a connector attachment portion which defines an attachment position of the connector. The housing includes at least one wall portion protruding toward the substrate inside the housing and extending along an attachment direction of the connector.

Advantageous Effects of Invention

According to the present invention, it is possible to provide the in-vehicle device capable of preventing a foreign solid matter from approaching a power supply-related component and having excellent assemblability.

DESCRIPTION OF EMBODIMENTS

Figure 1:
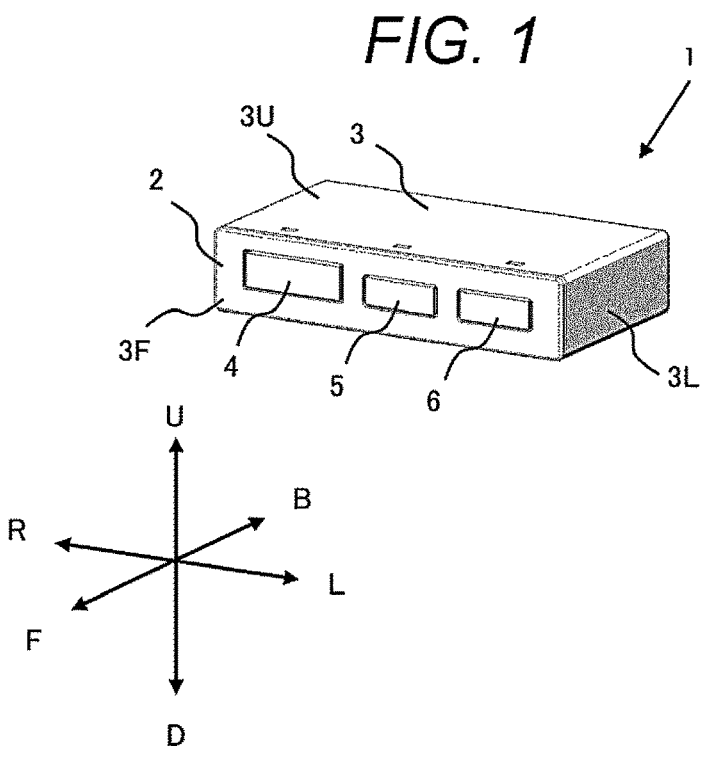
FIG. 1 is an external perspective view illustrating an in-vehicle device according to a first embodiment.

Hereinafter, embodiments of the present invention will be described with reference to the drawings. It should be noted that the embodiments are combined as long as there is no contradiction. In each embodiment, the same components are denoted by the same reference numerals, descriptions thereof are omitted, and feature portions thereof are described. In addition, in each drawing, a U direction is an upward direction, a D direction is a downward direction, an F direction is a front direction, a B direction is a back surface direction, an R direction is a right direction, and an L direction is a left direction.

<IP Standard>

An IP standard is a standard according to IEC (International Electrotechnical Standard) 60529 Amd.2Ed.2.0 b Cor.1:2019(b) and JIS (Japanese Industrial Standard) C 0920 (2003). The standard specifies a scheme for classifying the grade of the protective structure of an electromechanical device by its enclosure. By introducing the scheme for classifying the grade of the protective structure, the expression of protected content (degree) and a verification method thereof are made uniform.

<Purpose of This Standard>

The definition of the classification of the protection grade by the enclosure of electrical equipment is shown in the following (1) and (2). (1) Protection of human body from approaching hazardous locations within enclosure. (2) Protection of electrical equipment inside enclosure from intrusion of solid material from outside.

<IP Standard IP4X>

The IP standard IP4X defined by IEC 60529 Amd.2 Ed.2.0 b Cor. 1:2019(b) and JIS C 0920 (2003) is used as a standard for determining the effect of the present invention. IP4X specifies that a test probe having a diameter of 1 mm and a length of 100 mm is pushed in with a pressing force of 1 N. The test probe stops at a dead end without being inserted to be bent due to a pressing force.

First Embodiment

<Overall Configuration of in-Vehicle Device 1>

Figure 2:
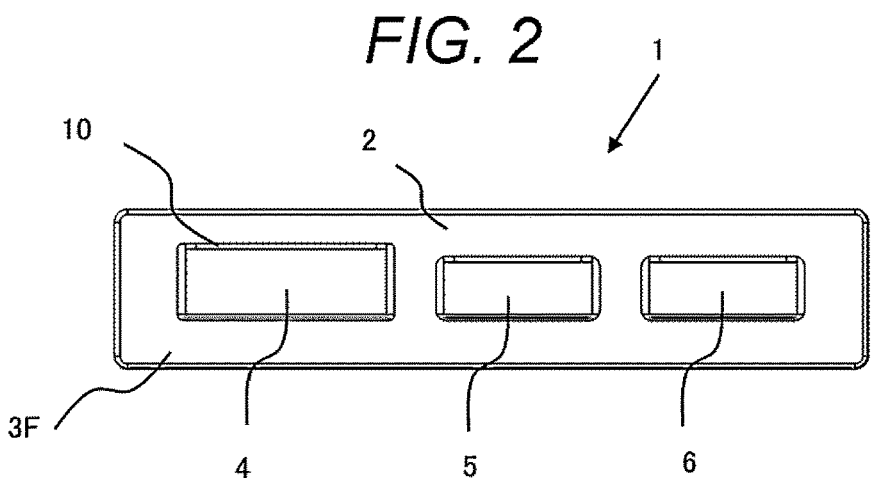
FIG. 2 is a front view of the in-vehicle device according to the first embodiment as viewed from a front direction of a housing.
Figure 2:
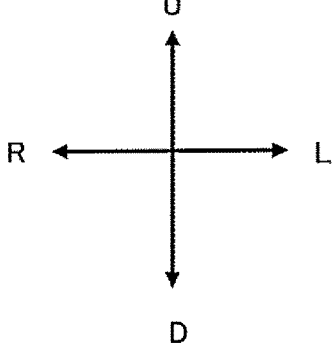
Figure 3:
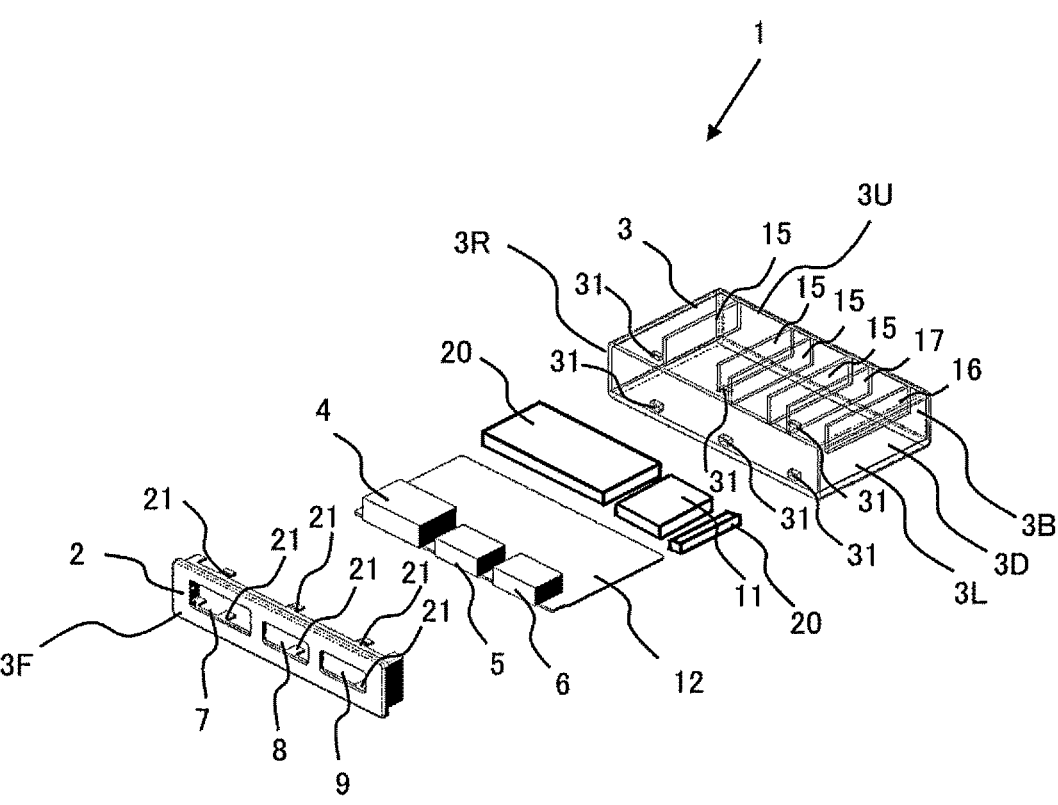
FIG. 3 is a component exploded perspective view illustrating the in-vehicle device according to the first embodiment.
Figure 3:
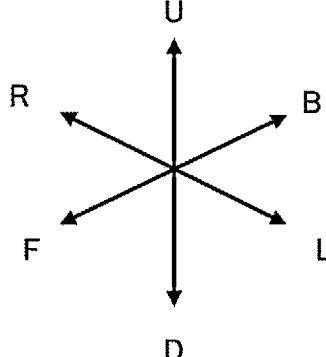
Figure 4:
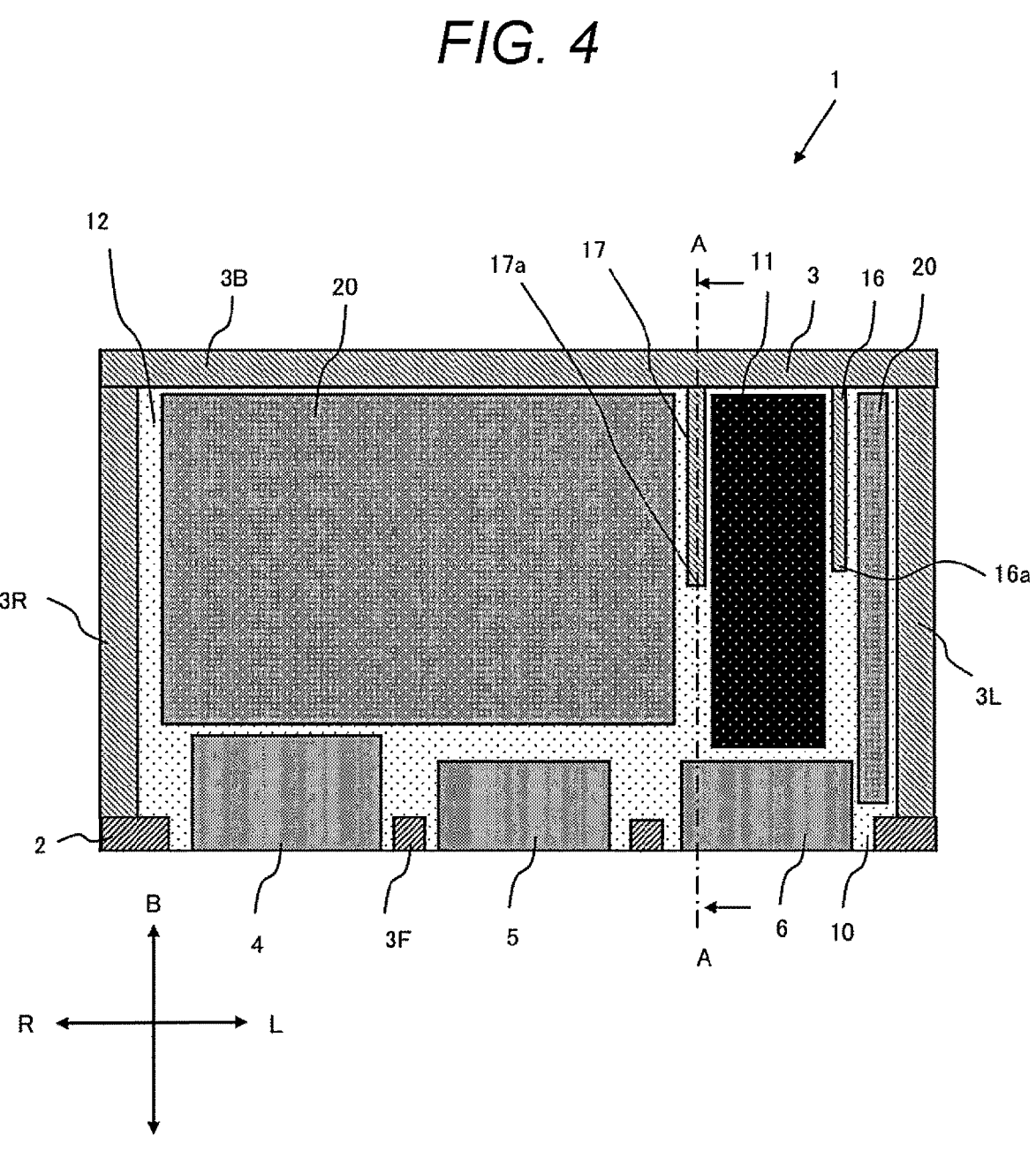
FIG. 4 is a transverse cross-sectional view illustrating the in-vehicle device according to the first embodiment in a transverse cross section taken along line B-B in FIG. 5.
Figure 5:
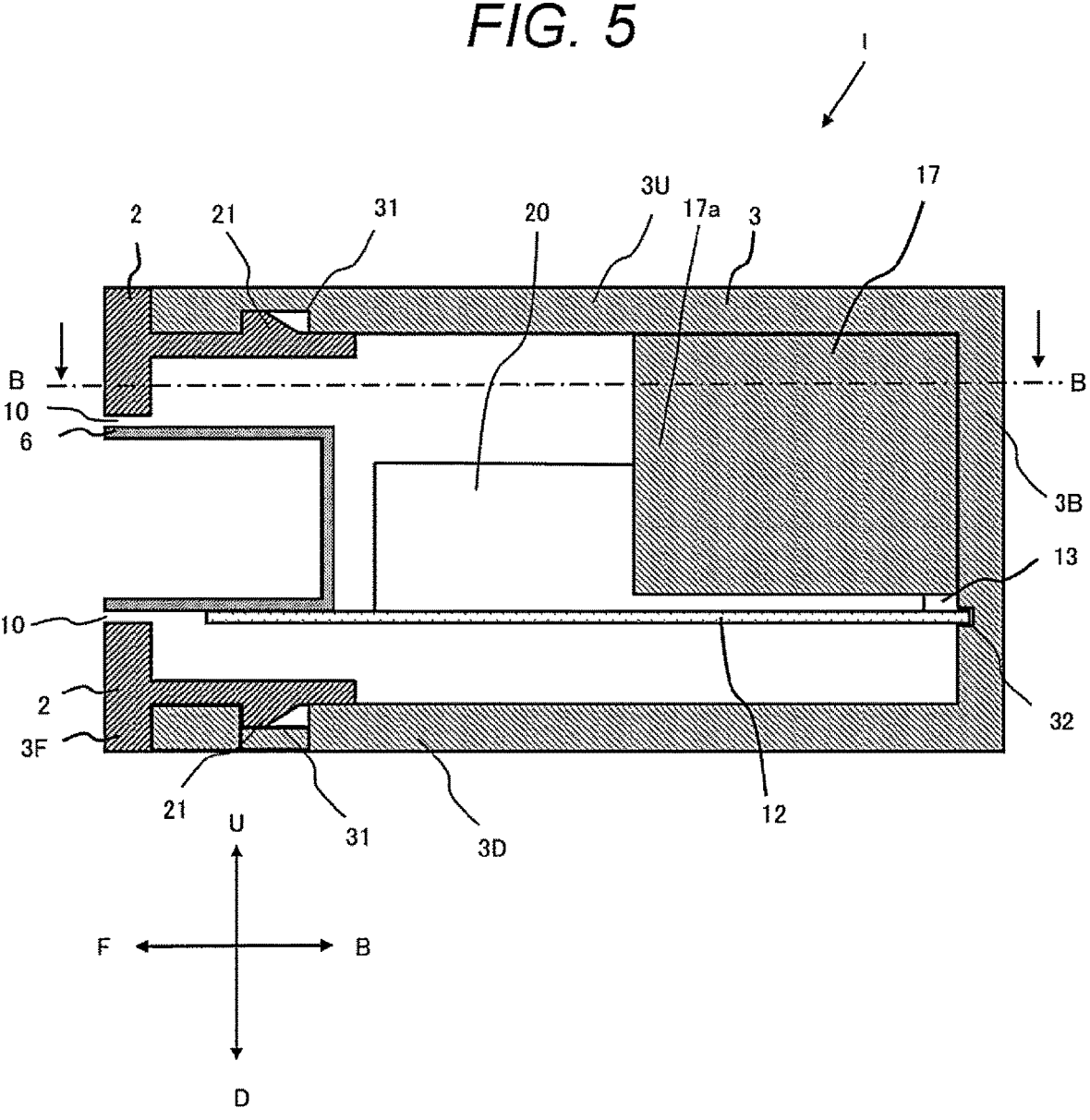
FIG. 5 is a longitudinal cross-sectional view illustrating the in-vehicle device according to the first embodiment in a longitudinal cross section taken along line A-A in FIG. 4.

A first embodiment will be described with reference to FIGS. 1 to 5. FIG. 1 is an external perspective view illustrating an in-vehicle device 1 according to the first embodiment. FIG. 2 is a front view of the in-vehicle device 1 according to the first embodiment as viewed from the front direction F of a housing 3. FIG. 3 is a component exploded perspective view illustrating the in-vehicle device 1 according to the first embodiment. FIG. 4 is a transverse cross-sectional view illustrating the in-vehicle device 1 according to the first embodiment in a transverse cross section taken along line B-B in FIG. 5. FIG. 5 is a longitudinal cross-sectional view illustrating the in-vehicle device 1 according to the first embodiment in a longitudinal cross section taken along line A-A in FIG. 4. The in-vehicle device 1 satisfies IP4X defined in the IEC standard 60529.

As illustrated in FIGS. 1 to 5, the in-vehicle device 1 includes the housing 3, a connector attachment portion 2, and a substrate 12.

The housing 3 is a box. The housing 3 includes a front surface portion 3F on which the connector attachment portion 2 is provided, an upper surface portion 3U, a lower surface portion 3D, a right surface portion 3R, a left surface portion 3L, and a back surface portion 3B facing the front surface portion 3F. The housing 3 is formed in an opening portion on the front surface portion 3F side of the housing 3. The housing 3 accommodates the substrate 12 therein and has the connector attachment portion 2 which defines attachment positions of connectors 4, 5, and 6.

The connector attachment portion 2 is a lid body of the housing 3. The connector attachment portion 2 is provided on the front surface portion 3F of the housing 3. The connector attachment portion 2 is formed to flush with the front surface of the housing 3 in the front direction F. The connector attachment portion 2 covers the opening portion of the housing 3 in the front direction F. Three opening portions 7, 8, and 9 are formed in the connector attachment portion 2.

The connector attachment portion 2 is attached to holes 31, which are provided on the inner wall side of the upper surface portion 3U and the lower surface portion 3D of the housing 3, by snap fitting. Three snap fits are provided at intervals on the right direction R side, the central side, and the left direction L side with respect to each of the upper side and the lower side. The snap fit includes the holes 31 provided on the inner wall sides of the upper surface portion 3U and the lower surface portion 3D of the housing 3, and claw portions 21 provided in the connector attachment portion 2 and engaged with the holes 31. The claw portions 21 are combined and engaged with the holes 31 which are provided in the housing 3 from the inner wall sides of the upper surface portion 3U and the lower surface portion 3D of the housing 3, so that the connector attachment portion 2 is fixed to the housing 3.

The substrate 12 has a circuit for electrical connection with an external device (not illustrated). The connectors 4, 5, and 6 for electrical connection with the external device are mounted on the substrate 12. That is, a plurality of connectors 4, 5, and 6 are provided. Each of the connectors 4, 5, and 6 exposes a connection portion with the external device in an opening range of each of the opening portions 7, 8, and 9 of the connector attachment portion 2. The connectors 4, 5, and 6 electrically connect the external device and the substrate 12 by connection of the terminals of the external device. The connectors 4, 5, and 6 are mounted on the substrate 12 without any gap from the substrate 12.

The substrate 12 is configured to be slid from the opening portion in the front direction F of the housing 3 toward a back surface direction B to be incorporated into the housing 3 formed in a bag shape. The substrate 12 is fitted and fixed in a groove 32 formed on the inner wall side of the back surface portion 3B of the housing 3.

On the substrate 12, a power supply circuit unit to which a voltage and a current of an in-vehicle battery are supplied and which internally distributes the voltage and the current, and a power supply-related component 11 and an electrical component 20 around the power supply circuit unit are mounted. The power supply-related component 11 is a dangerous location to be used for the purposes (1) and (2) in the IP standard IP4X. The power supply-related component 11 is disposed in a projection region in the back surface direction B of the connector 6. The electrical component 20 other than the power supply-related component 11 is not subject to the IP standard IP4X. The power supply circuit unit is formed in the substrate 12.

<Gap 10>

A gap 10 into which a foreign solid matter can intrude from the outside of the housing 3 is formed between the connectors 4, 5, and 6 and the connector attachment portion 2. That is, the gap 10 of 1 mm or more is provided between each of the opening portions 7, 8, and 9 for the connectors 4, 5, and 6 and each of the connectors 4, 5, and 6.

As for the gap 10, manufacturing variations of the substrate 12, shape variations of the connectors 4, 5, and 6, positional variations when the connectors 4, 5, and 6 are mounted, positional variations when the substrate 12 is inserted into the housing 3 to be assembled, manufacturing variations of the connector attachment portion 2, and positional variations when the housing 3 and the connector attachment portion 2 are assembled are considered when these components are assembled into equipment.

Therefore, it is considerably difficult to make the gap 10 less than 1 mm. If the gap 10 is set to be less than 1 mm, it leads to an increase in cost such as labor cost and dimensional management cost due to a manual arrangement of the in-vehicle device 1.

In addition, since the shapes of the fitting surfaces of the connectors 4, 5, and 6 adopted in the opening portions 7, 8, and 9 for the connectors 4, 5, and 6 are not necessarily square or rectangular, the gap 10 is secured from the outermost periphery of the fitting surfaces of the connectors 4, 5, and 6, and the shapes of the opening portions 7, 8, and 9 for the connectors 4, 5, and 6 are made simple square or rectangular. Accordingly, the shape of the connector attachment portion 2 can be reused with minor changes of the connectors 4, 5, and 6.

For the above reason, the gap 10 into which the test probe 14 having a diameter of 1 mm and a length of 100 mm can be pushed with a pressing force of 1 N is formed between each of the plurality of connectors 4, 5, and 6 and the connector attachment portion 2 disposed around each of the plurality of connectors 4, 5, and 6.

Specifically, the IP standard IP4X defined by IEC60529 and JIS C 920 is used as a standard, and in accordance with the IP4X standard, the gap 10 having a width of 1.5 mm into which the test probe 14 having a diameter of 1 mm and a length of 100 mm can be pushed with a pressing force of 1 N is formed between each of the three connectors 4, 5, and 6 and the connector attachment portion 2 around each of the three connectors 4, 5, and 6.

<Six Wall Portions 15, 16, and 17>

The housing 3 has six wall portions 15, 16, and 17, which protrude toward the substrate 12 and extend along the attachment direction of the connectors 4, 5, and 6, inside the housing 3. Here, the attachment direction of the connectors 4, 5, and 6 is a direction in which a terminal of an external device (not illustrated) is inserted into the connectors 4, 5, and 6, that is, a direction from the front surface portion 3F toward the back surface portion 3B (back surface direction B). The six wall portions 15, 16, and 17 are disposed at positions overlapping the connectors 4, 5, and 6 when viewed from the attachment direction of the connectors 4, 5, and 6. The height of the six wall portions 15, 16, and 17 is a height that does not allow the contact with the substrate 12.

<First Wall Portion 17 and Second Wall Portion 16>

The housing 3 includes, as a part of the six wall portions 15, 16, and 17, a first wall portion 17 and a second wall portion 16 disposed to face each other with the power supply-related component 11 interposed therebetween.

The first wall portion 17 is disposed at a position overlapping the connector 6 among the connectors 4, 5, and 6 when viewed from the attachment direction of the connector 6. The first wall portion 17 is disposed closer to the center of the housing 3 than the second wall portion 16.

The second wall portion 16 is disposed at a position overlapping the connector 6 when viewed from the attachment direction of the connector 6.

Specifically, the first wall portion 17 and the second wall portion 16 are configured such that the test probe 14 cannot contact the power supply-related component 11 on the substrate 12 with respect to the intrusion of the foreign solid matter through left and right gaps between the connector attachment portion 2 and the connectors 5 and 6. The first wall portion 17 and the second wall portion 16 extend in the front direction F from the back surface portion 3B inside the housing 3. That is, the first wall portion 17 and the second wall portion 16 protrude in the downward direction D from the inner wall side of the upper surface portion 3U toward the substrate 12. The power supply-related component 11, which is a dangerous location in the substrate 12, is disposed in a region sandwiched between the first wall portion 17 and the second wall portion 16. The power supply-related component 11 is a battery supply unit, a power supply circuit unit in the substrate 12, an output circuit of an actuator, or the like, and is also referred to as a live part.

<Gap 13 between Six Wall Portions 15, 16, 17 and Substrate 12>

A gap 13 in the vertical direction is provided between six wall portions 15, 16, and 17 and the substrate 12. It is desirable that no component is disposed between the six wall portions 15, 16, and 17 and the substrate 12, and the interval of the gap 13 in the vertical direction is less than 1 mm. The interval of the gap 13 in the vertical direction is desirably constant. The electrical component 20 mounted on the substrate 12 other than the power supply-related component 11 is referred to as an electric component of a non-live part.

<Integrally Forming Six Wall Portions 15, 16, 17 and Housing 3>

The six wall portions 15, 16, and 17 are integrally formed with the housing 3. The six wall portions 15, 16, and 17 are provided to extend from the back surface portion 3B toward the front direction F. That is, the six wall portions 15, 16, and 17 are disposed in parallel with the outer wall of the housing 3, so as to facilitate die-cutting of the housing 3, and enable integral molding of the housing 3 and the six wall portions 15, 16, and 17.

On the other hand, in a case where the wall portion is provided in a direction intersecting the opening portion of the housing 3 in the front direction F from the back surface portion 3B, the number of components and the assembly processes are increased. However, at least one of the wall portions 15, 16, and 17 may be a member separate from the housing 3.

<Relationship with Test Probe 14 for IP4X: Left and Right Gaps>

Figure 6:
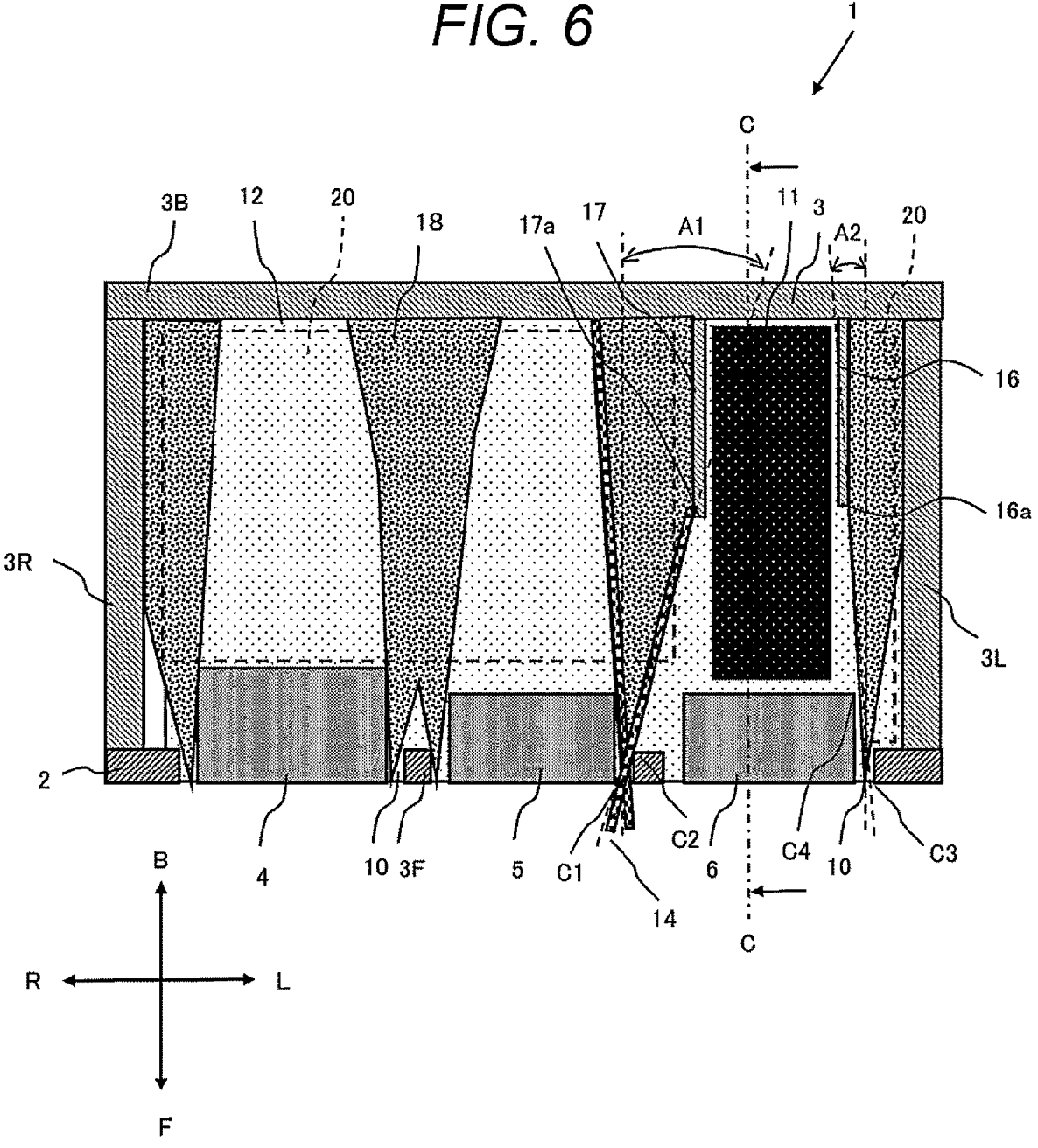
FIG. 6 is a transverse cross-sectional view illustrating a case where a test probe according to the first embodiment is inserted into a gap between a connector and a connector attachment portion from a right and left direction.

FIG. 6 is a transverse cross-sectional view illustrating a case where the test probe 14 according to the first embodiment is inserted into the gap 10 between the connectors 4, 5, and 6 and the connector attachment portion 2 from a right and left direction.

An intrusion range 18 of the test probe 14 can be calculated from the width of the gap 10 between the connectors 4, 5, and 6 and the connector attachment portion 2. Therefore, the length of the first wall portion 17 or the second wall portion 16 can be shortened depending on the calculation result of the intrusion range 18 of the test probe 14 and the position of the power supply-related component 11. As can be seen from FIG. 6, even in a case where there is no intrusion angle of the test probe 14, a certain length of the first wall portion 17 and the second wall portion 16 are required.

<Position of Distal End Portion 17a of First Wall Portion 17>

A state where the test probe 14 having a diameter of 1 mm and a length of 100 mm is pushed in with a pressing force of 1 N through the gap 10 between the connector 5 and the connector attachment portion 2 disposed around the connector 5 on the connector 6 side, the test probe 14 is in contact with a corner C1 on the front surface portion 3F side of the connector 5, and the test probe 14 is in contact with a corner C2 on the back surface portion 3B side of the connector attachment portion 2 is defined as a first maximum movable state A1 of the test probe 14 toward the power supply-related component 11 side. In the first maximum movable state A1, the first wall portion 17 extends from the back surface portion 3B to the front surface portion 3F side up to a position where the distal end portion of the test probe 14 abuts on the first wall portion 17.

With respect to the intrusion range 18 of the test probe 14 described above, the IP standard IP4X is used, and in accordance with the IP4X standard, the first wall portion 17 is provided at such a position that when the test probe 14 having a length of 100 mm and a diameter of 1 mm is pushed in with a pressing force of 1 N through the gap 10 between the connector 6 and the connector attachment portion 2 disposed around the left and right of the connector 6 or through the gap 10 between the connector 5 and the connector attachment portion 2 disposed around the connector 5 on the connector 6 side, the distal end portion of the test probe 14 abuts on the region on the front surface portion 3F side of the housing 3 in the first wall portion 17.

That is, the first wall portion 17 extends toward the front surface portion 3F starting from the back surface portion 3B of the housing 3 facing the front surface portion 3F, so as to intersect with a boundary line defining a maximum movable region of the foreign solid matter intruding through the gap 10 between the connector 6 and the connector attachment portion 2.

<Position of Distal End Portion 16*a* of Second Wall Portion 16>

A state where the test probe 14 having a diameter of 1 mm and a length of 100 mm is pushed in with a pressing force of 1 N through the gap 10 between the connector 6 and the connector attachment portion 2 disposed around the left and right of the connector 6 and provided on the opposite side of the connector 5, the test probe 14 is in contact with a corner C3 on the front surface portion 3F side of the connector attachment portion 2 disposed around the connector 6, and the test probe 14 is in contact with a corner C4 on the back surface portion 3B side of the connector 6 is defined as a second maximum movable state A2 of the test probe 14 toward the power supply-related component 11 side. In the second maximum movable state A2, the second wall portion 16 extends from the back surface portion 3B to the front surface portion 3F side up to a position where the distal end portion of the test probe 14 abuts on the second wall portion 16.

<Relationship with Test Probe 14 for IP4X: Upper and Lower Gaps 10>

Figure 7:
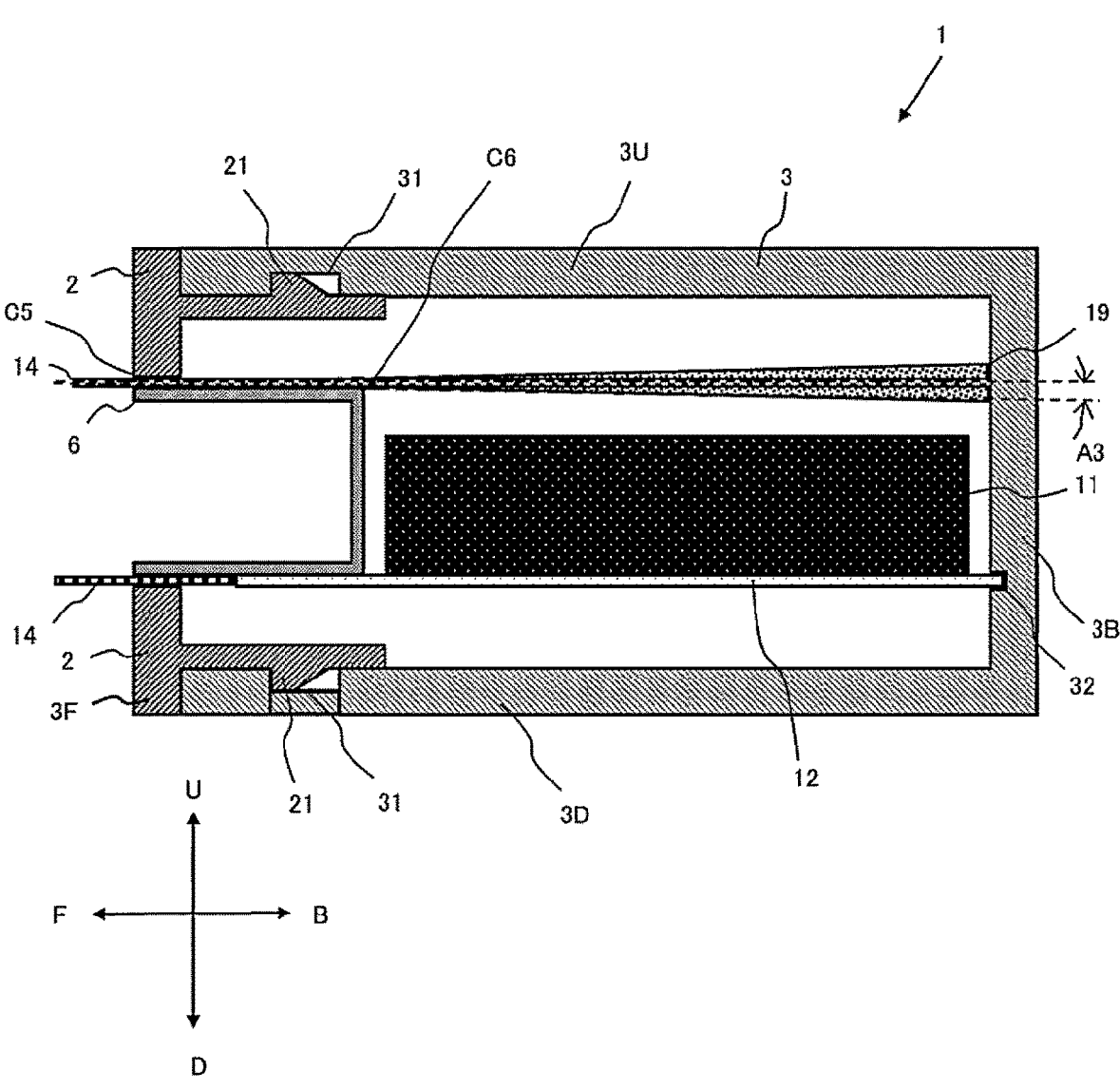
FIG. 7 is a longitudinal cross-sectional view illustrating a case where the test probe according to the first embodiment is inserted into the gap between the connector and the connector attachment portion from a vertical direction, in a longitudinal cross section taken along line C-C in FIG. 6.

FIG. 7 is a longitudinal cross-sectional view illustrating a case where the test probe 14 according to the first embodiment is inserted into the gap 10 between the connector 6 and the connector attachment portion 2 from the vertical direction, in a longitudinal cross section taken along line C-C in FIG. 6.

An intrusion range 19 is set with respect to the intrusion of the test probe 14 through the gap 10 in the upward direction U of the connector 6. In this case, the test probe 14 does not come into contact with the power supply-related component 11. When the test probe 14 intrudes through the gap 10 in the downward direction D of the connector 6, the test probe 14 abuts on the substrate 12. Therefore, the test probe 14 cannot intrude into the housing 3.

<Intrusion of Test Probe 14 into Gap 10 in Upward Direction U of Connector 6>

The IP standard IP4X is used, and in accordance with the IP4X standard, the gap 10 into which the test probe 14 having a diameter of 1 mm and a length of 100 mm can be pushed with a pressing force of 1 N is formed between the connector 6 and the connector attachment portion 2 disposed in the upward direction U of the connector 6.

In this case, when the test probe 14 is caused to intrude into the gap 10 between the connector 6 and the connector attachment portion 2 disposed in the upward direction U of the connector 6, in the distal end portion of the test probe 14, the test probe 14 comes into contact with a corner portion C5 on the front surface portion 3F side of the connector attachment portion 2 disposed in the upward direction U of the connector 6, and the test probe 14 comes into contact with a corner portion C6 on the back surface portion 3B side of the connector 6, so as to obtain a third maximum movable state A3 of the test probe 14 toward the power supply-related component 11 side. Further, in the third maximum movable state A3, the test probe 14 only moves in the upward direction U above the height of the power supply-related component 11, and the test probe 14 does not come into contact with the power supply-related component 11.

<Intrusion of Test Probe 14 into Gap 10 in Downward Direction D of Connector 6>

The gap 10 into which the test probe 14 having a diameter of 1 mm and a length of 100 mm can be pushed with a pressing force of 1 N is formed between the connector 6 and the connector attachment portion 2 disposed in the downward direction D of the connector 6.

In this case, when the test probe 14 is pushed in through the gap 10 between the connector 6 and the connector attachment portion 2 disposed in the downward direction D of the connector 6, the distal end portion of the test probe 14 abuts on the end portion of the substrate 12 on the connector attachment portion 2 side.

<Intrusion into Vertical Gap 13 between First Wall Portion 17 and Second Wall Portion 16 of Test Probe 14 and Substrate 12>

The IP standard IP4X is used, and in accordance with the IP4X standard, the gap 13 is formed between the first wall portion 17 and the second wall portion 16, and the substrate 12 such that when a test probe having a diameter of 1 mm and a length of 100 mm is pushed in with a pressing force of 1 N, the distal end portion of the test probe 14 abuts on the first wall portion 17 and the second wall portion 16 and does not penetrate therethrough. As described above, the vertical width of the gap 13 is less than 1 mm.

Second Embodiment

Figure 8:
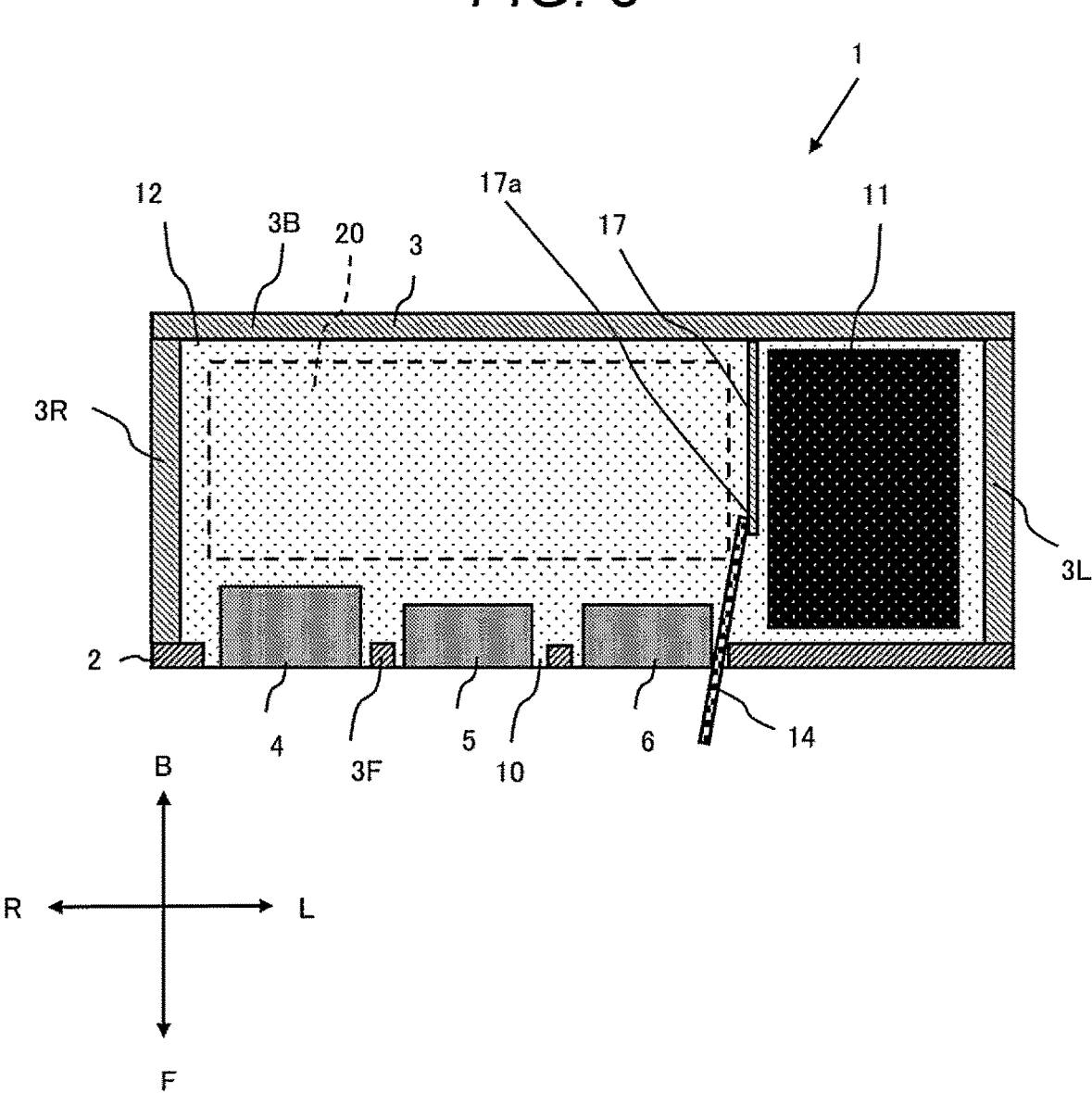
FIG. 8 is a transverse cross-sectional view illustrating an in-vehicle device according to a second embodiment.

FIG. 8 is a transverse cross-sectional view illustrating the in-vehicle device 1 according to a second embodiment. As illustrated in FIG. 8, the power supply-related component 11 is not within the projection region of the connector 6 in the back surface direction B. The power supply-related component 11 is formed adjacent in the left direction L to the inside of the region in the back surface direction B of the connector 6 and disposed between the first wall portion 17 and the left surface portion 3L of the housing 3. Therefore, the second wall portion 16 is not provided, supply-related component 11 is sandwiched by the first wall portion 17 and the inner wall side of the left surface portion 3L of the housing 3.

Due to a function request for the in-vehicle device 1, the number of connectors of the first embodiment is not changed, but a circuit scale is increased, and a substrate area for mounting components may be required. In this case, it is conceivable to enlarge the housing 3. Further, the power supply-related component 11 is not limited to being disposed in the extending direction of the gap 10 between the connector 6 and the connector attachment portion 2, but is disposed at a location that allows protection. Therefore, by providing one first wall portion 17, it is possible to prevent the test probe 14 from approaching the power supply-related component 11.

Third Embodiment

Figure 9:
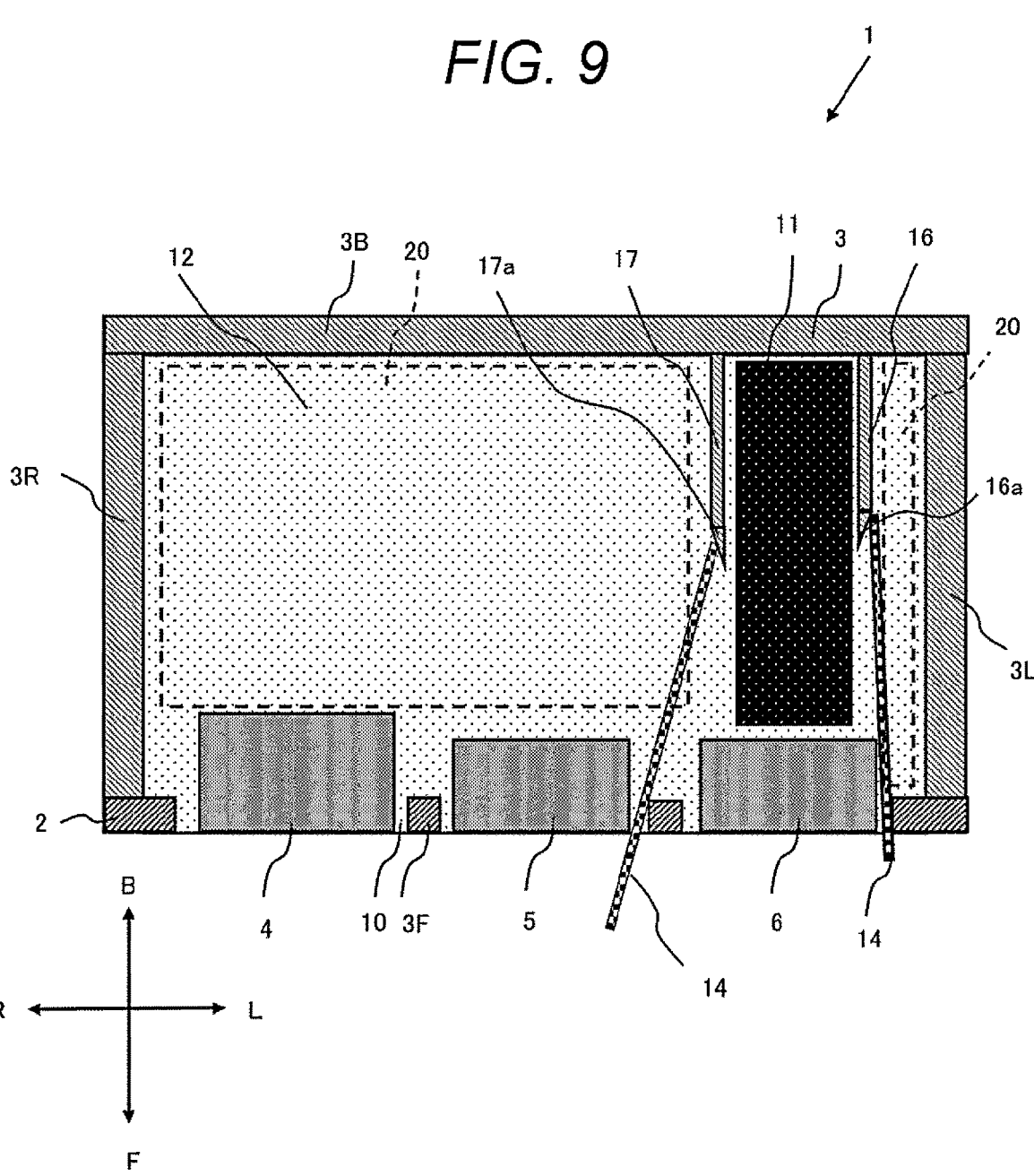
FIG. 9 is a transverse cross-sectional view illustrating an in-vehicle device according to a third embodiment.

FIG. 9 is a transverse cross-sectional view illustrating the in-vehicle device 1 according to a third embodiment. As illustrated in FIG. 9, a distal end portion 17*a* of the first wall portion 17 and a distal end portion 16*a* of the second wall portion 16 are formed in a tapered shape. Note that the length of the first wall portion 17 from the back surface portion 3B of the housing 3 to the distal end portion 17*a* in the front direction F is adjusted to the configuration of the first embodiment. The length of the second wall portion 16 from the back surface portion 3B of the housing 3 to the distal end portion 16a in the front direction F is adjusted to the configuration of the first embodiment.

In a case where the intrusion angle of the test probe 14 becomes shallow, the distal end portions 17a and 16a of the first wall portion 17 and the second wall portion 16 facing the connector 6 are formed in a tapered shape. The tapered shapes of the distal end portions 17a and 16a of the first wall portion 17 and the second wall portion 16 have taper angles obtained by extending the power supply-related component 11 side in the front direction F and shortening the side opposite to the power supply-related component 11 side in the back surface direction B. Accordingly, the test probe 14 slides by the taper angles of the distal end portions 17a and 16a of the first wall portion 17 and the second wall portion 16 and flows in the opposite side to the power supply-related component 11 side and in the back surface direction B, so that there is an effect of further preventing the intrusion of the test probe 14.

Fourth Embodiment

Figure 10:
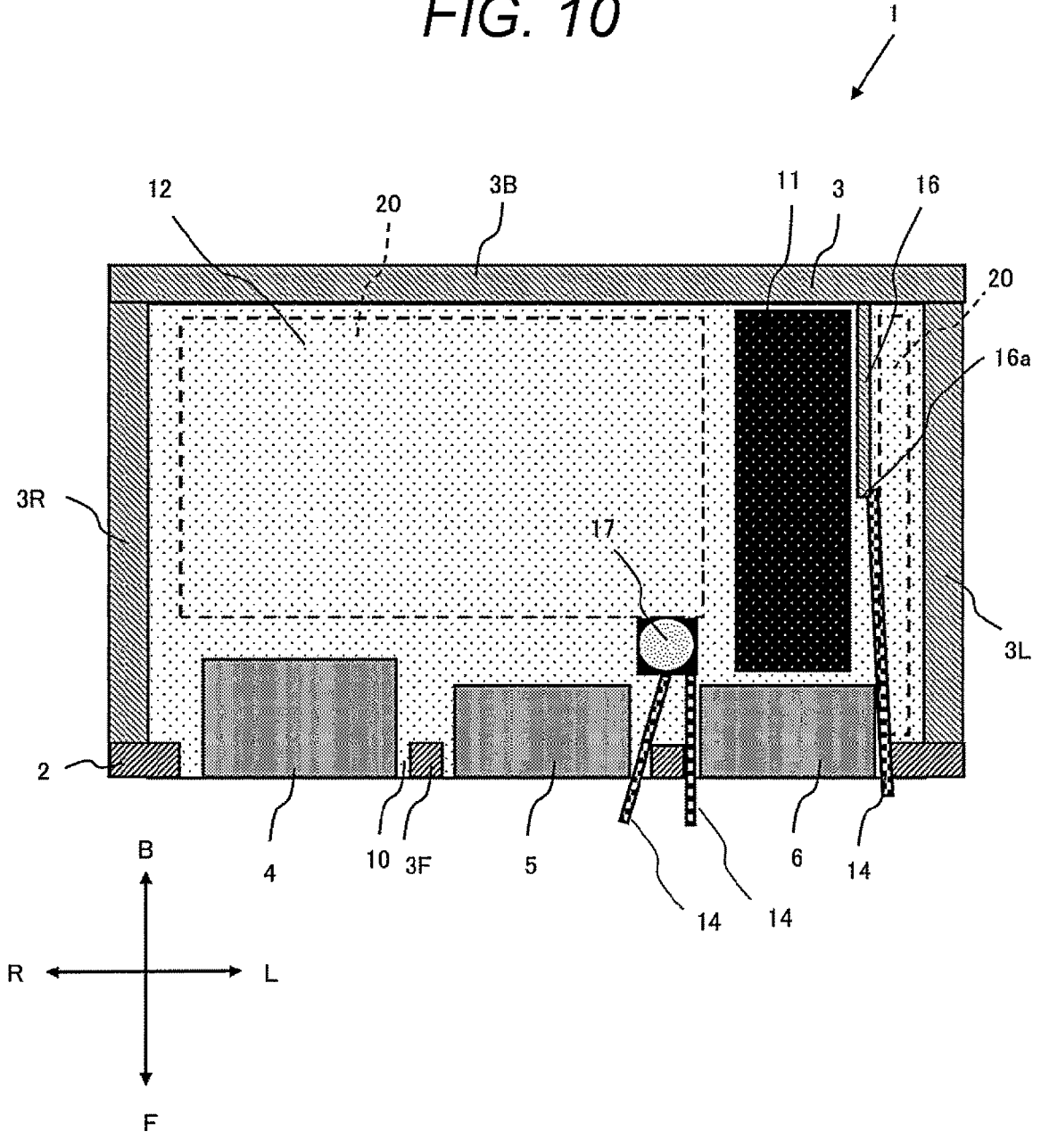
FIG. 10 is a transverse cross-sectional view illustrating an in-vehicle device according to a fourth embodiment.

FIG. 10 is a transverse cross-sectional view illustrating the in-vehicle device 1 according to a fourth embodiment. As illustrated in FIG. 10, at least one first wall portion 17 of the first wall portion 17 or the second wall portion 16 is disposed to cover the gap 10 between the connector 6 and the connector attachment portion 2. The first wall portion 17 is disposed between the connector 5 and the connector 6 among the connectors 4, 5, and 6.

As the first wall portion 17, a tall component such as an electrolytic capacitor is disposed in the extending direction of the gap 10 in the back surface direction B. Also in this case, there is an effect of preventing the intrusion of the test probe 14. Here, it is necessary to consider that a surface without the GND terminal of the electronic component or terminals is disposed toward the gap 10 so that the electrolytic capacitor or the like as the first wall portion 17 does not face outward.

Effects (A) The in-vehicle device 1 includes a substrate 12 on which a power supply circuit unit to which a voltage and a current of an in-vehicle battery are supplied and which internally distributes the voltage and the current and a power supply-related component 11 around the power supply circuit unit are mounted. The in-vehicle device 1 is mounted on the substrate 12 and includes the connectors 4, 5, and 6 that electrically connect an external device and the substrate 12. The in-vehicle device 1 includes the housing 3 which accommodates the substrate 12 therein and has the connector attachment portion 2 which defines the attachment positions of the connectors 4, 5, and 6. The housing 3 has at least one of the wall portions 17 and 16 which protrudes toward the substrate 12 inside the housing 3 and extends along the attachment direction of the connector 6 (see FIG. 4).

The gap 10 for absorbing tolerances of the substrate 12, the connectors 4, 5, and 6, the housing 3, and the connector attachment portion 2 is formed between the connectors 4, 5, and 6 and the connector attachment portion 2. Accordingly, the in-vehicle device 1 can be easily assembled in equipment. In addition, the opening portions 7, 8, and 9 of the connector attachment portion 2 are formed such that the gap 10 is formed between the connectors 4, 5, and 6 and the connector attachment portion 2, and thus the degree of freedom in selecting the connectors 4, 5, and 6 can be improved.

The gap 10 between the connectors 4, 5, and 6 and the connector attachment portion 2 allows the intrusion of the foreign solid matter. In this regard, in the above embodiments, as described above, the wall portions 17 and 16 extending along the attachment direction of the connectors 4, 5, and 6 are provided in the housing 3. Therefore, the wall portions 17 and 16 prevent the foreign solid matter from approaching the power supply-related component 11. In the in-vehicle device 1 according to the above embodiments, the IP standard IP4X is satisfied, and the approach of the foreign solid matter to the power supply-related component 11 is prevented, so that the protection of the human body and the electrical protection of the power supply-related component 11 via the foreign solid matter are appropriately performed. In addition, the wall portions 17 and 16 for preventing the intrusion of the foreign solid matter have a simple structure of extending along the attachment direction of the connector 6 in the housing 3, and do not adversely affect the assembly of the connector 6 and the connector attachment portion 2.

Therefore, according to the above embodiments, it is possible to prevent the foreign solid matter from approaching the power supply-related component 11, and it is possible to provide the in-vehicle device 1 having excellent assemblability.

(B) At least one of the wall portions 17 and 16 is disposed at a position overlapping the connector 6 when viewed from the attachment direction of the connector 6 (see FIG. 4).

In this configuration, it is possible to prevent the foreign solid matter from approaching the power supply-related component 11 provided in the back surface direction B of the connector 6.

(C) As at least one of the wall portions 17 and 16, the first wall portion 17 and the second wall portion 16 disposed to face each other with the power supply-related component 11 interposed therebetween are included (see FIG. 4).

In this configuration, the first wall portion 17 and the second wall portion 16 face each other with the power supply-related component 11 interposed therebetween, and it is possible to prevent the approach of the foreign solid matter.

(D) The gap 10 into which the foreign solid matter can intrude from the outside of the housing 3 is formed between the connectors 4, 5, and 6 and the connector attachment portion 2 (see FIG. 2).

In this configuration, the gap 10 between the connectors 4, 5, and 6 and the connector attachment portion 2 allows the intrusion of the foreign solid matter. However, at least one wall portions 17 or 16 protrudes toward the substrate 12 inside the housing 3 and extends along the attachment direction of the connector 6. Therefore, the foreign solid matter cannot approach the power supply-related component 11. Further, the prevention of the approach of the foreign solid matter to the power supply-related component 11 establishes the protection of the human body and the electrical protection of the power supply-related component via the foreign solid matter, and satisfies the IP standard IP4X.

(E) The first wall portion 17 of at least one of the first wall portion 17 or the second wall portion 16 is disposed to cover the gap 10 between the connectors 5 and 6 and the connector attachment portion 2 (see FIG. 10).

In this configuration, the first wall portion 17 covers the gap 10 between the connectors 5 and 6 and the connector attachment portion 2. Therefore, the foreign solid matter cannot approach the power supply-related component 11.

(F) The in-vehicle device 1 satisfies IP4X defined in the IEC standard 60529.

In this configuration, it is possible to comply with the IP standard IP4X as a reference while preventing the foreign solid matter from approaching the power supply-related component 11.

(G) The first wall portion 17 is disposed between the connector 6 and the connector 5 among the connectors 4, 5, and 6. The connector attachment portion 2 is provided on the front surface portion 3F of the housing 3. The first wall portion 17 extends toward the front surface portion 3F starting from the back surface portion 3B of the housing 3 facing the front surface portion 3F, so as to intersect with a boundary line defining a maximum movable region of the foreign solid matter intruding through the gap 10 between the connector 6 and the connector attachment portion 2 (see FIG. 6).

In this configuration, while complying with the IP standard IP4X as a reference, the first wall portion 17 of only a necessary length is provided. Accordingly, the degree of freedom of component layout on the substrate 12 inside the housing 3 can be improved.

(H) The height of the at least one of the wall portions 17 and 16 is a height that does not allow the contact with the substrate 12 (see FIG. 5).

In this configuration, since at least one of the wall portions 17 and 16 does not come into contact with the substrate 12, an adverse effect of damaging a component on the substrate 12 at the time of assembly does not occur.

(I) The first wall portion 17 is disposed closer to the center of the housing 3 than the second wall portion 16 (see FIG. 4).

In this configuration, the first wall portion 17 extends from the back surface portion 3B of the housing 3 toward the front surface portion 3F of the housing 3, through the gap 10 between the connector 5 and the connector attachment portion 2 disposed around the connector 5 on the connector 6 side up to a position where the distal end portion of the test probe 14 in the maximum movable state abuts on the first wall portion 17. Therefore, it is possible to comply with the IP standard IP4X as a reference while preventing the foreign solid matter from approaching the power supply-related component 11.

(J) At least one of the wall portions 17 and 16 is integrally formed with the housing 3 (see FIG. 3).

In this configuration, the housing 3 including at least one of the wall portions 17 and 16 is easily manufactured. Accordingly, die-cutting of the housing 3 is facilitated, and the housing 3 can be formed by integral molding. Further, the number of components and the assembly processes can be reduced.

(K) At least one of the wall portions 17 and 16 is a member separate from the housing 3.

In this configuration, at least one of the wall portions 17 and 16 and the housing 3 can be manufactured by using different materials in different manufacturing processes.

(L) The housing 3 includes the front surface portion 3F on which the connector attachment portion 2 is provided and the back surface portion 3B facing the front surface portion 3F. The first wall portion 17 is disposed at a position overlapping the connector 6 among the connectors 4, 5, and 6 when viewed from the attachment direction of the connectors 4, 5, and 6. A state where the test probe 14 having a diameter of 1 mm and a length of 100 mm is pushed in with a pressing force of 1 N through the gap 10 between the connector 5 and the connector attachment portion 2 disposed around the connector 5 on the connector 6 side, the test probe 14 is in contact with the corner C1 on the front surface portion 3F side of the connector 5, and the test probe 14 is in contact with the corner C2 on the back surface portion 3B side of the connector attachment portion 2 is defined as the first maximum movable state A1 of the test probe 14 toward the power supply-related component 11 side. In the first maximum movable state A1, the first wall portion 17 extends from the back surface portion 3B to the front surface portion 3F side up to a position where the distal end portion of the test probe 14 abuts on the first wall portion 17 (see FIG. 6).

In the in-vehicle device 1, a predetermined gap 10 is formed between the connectors 4, 5, and 6 and the connector attachment portion 2 in order to absorb tolerances of the substrate 12, the connectors 4, 5, and 6, the housing 3, and the connector attachment portion 2 so that assembly in equipment can be performed. In addition, the gap 10 between the connectors 4, 5, and 6 and the connector attachment portion 2 allows for margins in the selection of the connectors 4, 5, and 6, enabling the reuse of the connector opening shape of the connector attachment portion 2.

At this time, the gap 10 between the connectors 4, 5, and 6 and the connector attachment portion 2 allows the intrusion of the f solid matter. Here, in this configuration, the housing 3 includes the first wall portion 17 and the second wall portion 16 which are disposed to face each other inside the housing 3 and interpose the power supply-related component 11. Therefore, the foreign solid matter cannot approach the power supply-related component 11. Further, the prevention of the approach of the foreign solid matter to the power supply-related component 11 establishes the protection of the human body and the electrical protection of the power supply-related component via the foreign solid matter, and satisfies the IP standard IP4X.

Therefore, it is possible to comply with the IP standard IP4X as a reference while preventing the foreign solid matter from approaching the power supply-related component 11.

In addition, in this configuration, while complying with the IP standard IP4X as a reference, the first wall portion 17 of only a necessary length is provided. Accordingly, the degree of freedom of component layout on the substrate 12 inside the housing 3 can be improved.

(M) A plurality of connectors 4, 5, and 6 are provided. The gap 10 into which the test probe 14 having a diameter of 1 mm and a length of 100 mm can be pushed with a pressing force of 1 N is formed between each of the plurality of connectors 4, 5, and 6 and the connector attachment portion 2 disposed around each of the plurality of connectors 4, 5, and 6 (see FIG. 2).

In this configuration, the gap 10 between the connectors 4, 5, and 6 and the connector attachment portion 2 allows the intrusion of the foreign solid matter. However, the housing 3 includes the first wall portion 17 and the second wall portion 16 which are disposed to face each other inside the housing 3 and interpose the power supply-related component 11. Therefore, the foreign solid matter cannot approach the power supply-related component 11. Further, the prevention of the approach of the foreign solid matter to the power supply-related component 11 establishes the protection of the human body and the electrical protection of the power supply-related component via the foreign solid matter, and satisfies the IP standard IP4X.

(N) The gap 10 into which the test probe 14 having a diameter of 1 mm and a length of 100 mm can be pushed with a pressing force of 1 N is formed between the connector 6 and the connector attachment portion 2 disposed in the downward direction D of the connector 6. The connector 6 is mounted on the substrate 12 without any gap from the substrate 12. When the test probe 14 is pushed in through the gap 10 between the connector 6 and the connector attachment portion 2 disposed in the downward direction D of the connector 6, the distal end portion of the test probe 14 abuts on the end portion of the substrate 12 on the connector attachment portion 2 side (see FIG. 7).

In this configuration, it is possible to comply with the IP standard IP4X as a reference while preventing the foreign solid matter from approaching the power supply-related component 11.

(O) A state where the test probe having a diameter of 1 mm and a length of 100 mm is pushed in with a pressing force of 1 N through the gap 10 between the connector 6 and the connector attachment portion 2 disposed around the left and right of the connector 6 and provided on the opposite side of the connector 5, the test probe 14 is in contact with the corner C3 on the front surface portion 3F side of the connector attachment portion 2 disposed around the connector 6, and the test probe 14 is in contact with the corner C4 on the back surface portion 3B side of the connector 6 is defined as the second maximum movable state A2 of the test probe 14 toward the power supply-related component 11 side. In the second maximum movable state A2, the second wall portion 16 extends from the back surface portion 3B to the front surface portion 3F side up to a position where the distal end portion of the test probe 14 abuts on the second wall portion 16 (see FIG. 6).

In this configuration, while complying with the IP standard IP4X as a reference, the second wall portion 16 of only a necessary length is provided. Accordingly, the degree of freedom of component layout on the substrate 12 inside the housing 3 can be improved.

(P) The first wall portion 17 is provided between the connector 6 disposed at a position overlapping the first wall portion 17 when viewed from the attachment direction of the connector 6 among the connectors 4, 5, and 6 and the connector 5 adjacent to the connector 6. The IP standard IP4X is used, and in accordance with the IP4X standard, the first wall portion 17 is provided at such a position that when the test probe 14 having a length of 100 mm and a diameter of 1 mm is pushed in with a pressing force of 1 N through the gap 10 between the connector 6 and the connector attachment portion 2 disposed around the left and right of the connector 6 or through the gap 10 between the connector 5 and the connector attachment portion 2 disposed around the connector 5 on the connector 6 side, the distal end portion of the test probe 14 abuts on the region on the front surface portion 3F side of the housing 3 in the first wall portion 17 (see FIG. 10).

In this configuration, while complying with the IP standard IP4X as a reference, only a necessary portion of the first wall portion 17 is provided. Accordingly, the degree of freedom of component layout on the substrate 12 inside the housing 3 can be improved.

Although the embodiments of the present invention have been described above, the above embodiments merely illustrate a part of the application example of the present invention, and the technical scope of the present invention is not intended to be limited to the specific configuration of the above embodiments.

REFERENCE SIGNS LIST

1 in-vehicle device
2 connector attachment portion
3 housing
3B back surface portion
3D lower surface portion
3F front surface portion
3L left surface portion
3R right surface portion
3U upper surface portion
4 connector
5 connector
6 connector
7 opening portion
8 opening portion
9 opening portion
10 gap
11 power supply-related component
12 substrate
13 gap
14 test probe
15 wall portion
16 second wall portion
16a distal end portion
17 first wall portion
17a distal end portion
18 intrusion range
19 intrusion range
20 electrical component
21 claw portion
31 hole
32 groove

The invention claimed is:

1. An in-vehicle device comprising:

a substrate on which a power supply circuit unit to which a voltage and a current of an in-vehicle battery are supplied and which distributes the voltage and the current therein and a power supply-related component around the power supply circuit unit are mounted;

a connector which is mounted on the substrate and electrically connects an external device and the substrate; and a housing which accommodates the substrate therein and includes a connector attachment portion which defines an attachment position of the connector, wherein:

the housing includes at least one wall portion protruding toward the substrate inside the housing and extending along an attachment direction of the connector;

the at least one wall portion is disposed at a position overlapping the connector when viewed from the attachment direction of the connector;

a first wall portion and a second wall portion which are disposed to face each other with the power supply-related component interposed therebetween are provided as the at least one wall portion;

a gap which a foreign solid matter is able to intrude from an outside of the housing is formed between the connector and the connector attachment portion;

the housing includes a front surface portion on which the connector attachment portion is provided and a back surface portion facing the front surface portion;

the first wall portion is disposed at a position overlapping a first connector in the connector when viewed from the attachment direction of the connector;

when a state where a test probe having a diameter of 1 mm and a length of 100 mm is pushed in with a pressing force of 1 N through a gap between a second connector adjacent to the first connector and the connector attachment portion disposed around the second connector on the first connector side, the test probe comes into contact with a corner portion of the second connector on the front surface portion side, and the test probe comes into contact with a corner portion of the connector attachment portion on the back surface portion side is defined as a first maximum movable state of the test probe toward the power supply-related component; and in the first maximum movable state, the first wall portion extends from the back surface portion toward the front surface portion up to a position where a distal end portion of the test probe abuts on the first wall portion.

2. The in-vehicle device according to claim 1, wherein; at least one of the first wall portion and the second wall portion is disposed to cover the gap between the connector and the connector attachment portion.

3. The in-vehicle device according to claim 1, wherein: the in-vehicle device satisfies IP4X defined in IEC standard 60529.

4. The in-vehicle device according to claim 1, wherein: the connector attachment portion is provided in the front surface portion of the housing, and the first wall portion extends toward the front surface portion starting from the back surface portion of the housing facing the front surface portion, so as to intersect with a boundary line defining a maximum movable region of the foreign solid matter intruding through the gap between the connector and the connector attachment portion.

5. The in-vehicle device according to claim 1, wherein: a height of the at least one wall portion is a height that does not allow contact with the substrate.

6. The in-vehicle device according to claim 1, wherein: the first wall portion is disposed closer to a center of the housing than the second wall portion.

7. The in-vehicle device according to claim 1, wherein: the at least one wall portion is integrally formed with the housing.

8. The in-vehicle device according to claim 1, wherein; the at least one wall portion is a member separate from the housing.

9. The in-vehicle device according to claim 1, wherein: a plurality of connectors are provided, and a gap into which a test probe having a diameter of 1 mm and a length of 100 mm is able to be pushed with a pressing force of 1 N is formed between each of the plurality of connectors and the connector attachment portion disposed around each of the plurality of connectors.

10. The in-vehicle device according to claim 1, wherein: a gap into which a test probe having a diameter of 1 mm and a length of 100 mm is able to be pushed with a pressing force of 1 N is formed between the first connector and the connector attachment portion disposed below the first connector, the connector is mounted on the substrate without any gap from the substrate, and when the test probe is pushed in through the gap between the first connector and the connector attachment portion disposed below the first connector, the distal end portion of the test probe abuts on an end portion of the substrate on the connector attachment portion side.

11. The in-vehicle device according to claim 1, wherein when a state where a test probe having a diameter of 1 mm and a length of 100 mm is pushed in with a pressing force of 1 N through a gap between the first connector and the connector attachment portion disposed around a left and a right of the first connector and provided on an opposite side of the second connector, the test probe comes into contact with a corner portion on the front surface portion side of the connector attachment portion disposed around the first connector, and the test probe comes into contact with a corner portion of the first connector on the back surface portion side is defined as a second maximum movable state of the test probe toward the power supply-related component, in the second maximum movable state, the second wall portion extends from the back surface portion toward the front surface portion up to a position where the distal end portion of the test probe abuts on the second wall portion.

* * * * *